(12) United States Patent
Konet et al.

(10) Patent No.: US 7,445,350 B2
(45) Date of Patent: Nov. 4, 2008

(54) INTERIOR/EXTERIOR COMPONENT WITH ELECTROLUMINESCENT LIGHTING AND SOFT TOUCH SWITCHING

(75) Inventors: Heather S. Konet, Canton, MI (US); Jason M. Gray, Commerce Township, MI (US); Michael R. Miller, Commerce Township, MI (US); Jennifer J. Sterling, Livonia, MI (US)

(73) Assignee: Nissan Technical Center North America, Inc., Farmington Hills, MI (US)

( * ) Notice: Subject to any disclaimer, the term of this patent is extended or adjusted under 35 U.S.C. 154(b) by 327 days.

(21) Appl. No.: 11/207,906

(22) Filed: Aug. 22, 2005

(65) Prior Publication Data

US 2007/0041169 A1 Feb. 22, 2007

(51) Int. Cl.
  *F21V 9/16* (2006.01)
(52) U.S. Cl. .......................... 362/84; 362/276; 200/313
(58) Field of Classification Search ................ 362/489, 362/490, 84, 85, 276, 802; 427/66, 282; 312/506, 509, 511, 512; 345/36, 43; 200/310, 200/313, 314, 317
  See application file for complete search history.

(56) References Cited

U.S. PATENT DOCUMENTS

| | | | | |
|---|---|---|---|---|
| 4,143,297 A | * | 3/1979 | Fischer | 313/502 |
| 5,680,160 A | * | 10/1997 | LaPointe | 345/173 |
| 5,747,756 A | | 5/1998 | Boedecker | |
| 5,818,174 A | * | 10/1998 | Ohara et al. | 315/169.3 |
| 5,876,106 A | * | 3/1999 | Kordecki | 362/29 |
| 6,010,742 A | * | 1/2000 | Tanabe et al. | 427/66 |
| 6,464,381 B2 | | 10/2002 | Anderson, Jr. et al. | |
| 6,517,226 B1 | | 2/2003 | Zimmermann et al. | |
| 6,641,276 B1 | | 11/2003 | Macher et al. | |
| 6,773,129 B2 | | 8/2004 | Anderson, Jr. et al. | |
| 7,258,469 B2 | * | 8/2007 | Manico et al. | 362/394 |
| 2001/0030871 A1 | | 10/2001 | Anderson, Jr. et al. | |
| 2003/0002273 A1 | | 1/2003 | Anderson, Jr. et al. | |
| 2004/0217691 A1 | | 11/2004 | Opelka et al. | |
| 2005/0040769 A1 | | 2/2005 | Enz | |
| 2006/0087829 A1 | * | 4/2006 | Manico et al. | 362/84 |

* cited by examiner

*Primary Examiner*—Thomas M Sember
(74) *Attorney, Agent, or Firm*—Global IP Counselors, LLP

(57) ABSTRACT

A light panel includes an outer layer, a first proximity switch, an electroluminescent element and a base portion. The outer layer includes a translucent portion. The first proximity switch is disposed beneath the outer layer and has first and second electrically conductive switch portions that are arranged to form an electric field that emanates through the outer layer when the first proximity switch is energized. The electroluminescent element is disposed beneath the outer layer to provided backlighting to the outer layer. One of the first and second electrically conductive switch portions of the first proximity switch forms at least a portion of an electrode of the electroluminescent element. The base portion is disposed beneath the electroluminescent element and the first proximity switch.

22 Claims, 14 Drawing Sheets

INTERIOR/EXTERIOR COMPONENT WITH ELECTROLUMINESCENT LIGHTING AND SOFT TOUCH SWITCHING

BACKGROUND OF THE INVENTION

1. Field of the Invention

The present invention generally relates to a light panel with an integrated switch. More specifically, the present invention relates to a light panel having a proximity switch and an electroluminescent element where an electrode of the electroluminescent element is at least partially defined by an electrically conductive portion of the proximity switch.

2. Background Information

A proximity switch is a device that includes a structure that generates a magnetic field and circuitry that detects the proximity of an object (such as a finger) that disturbs the electric field when close to or in contact with the surface of the proximity switch. Proximity switches are gradually being integrated into a variety of technologies, including the automotive industry for use in interior switch applications. One of the advantages of proximity switches is that they require very little space compared to mechanical switch technologies such as push-push switches, knobs and rocker switches.

Another technology that is becoming increasingly useful in automotive interior applications is electroluminescent film or electroluminescent element lighting. Like proximity switches, electroluminescent films requires very little space compared to other lighting technologies such as incandescent light bulbs and LEDs (Light Emitting Diodes)

Currently proximity switch applications in automotive interiors include LEDs for switch backlighting. The basic proximity switch assembly includes an A-surface faceplate with screen printed translucent graphics. A light lens (or diffusion layer) adheres directly to the back of the A-surface faceplate. Below the light lens is an electronics layer that houses the LED light sources positioned below the face plate graphics and the proximity switch sensing pads. These switches take up an undesirable amount of space.

In view of the above, it will be apparent to those skilled in the art from this disclosure that there exists a need for an improved proximity switch with backlighting that takes up little space within a vehicle. This invention addresses this need in the art as well as other needs, which will become apparent to those skilled in the art from this disclosure.

SUMMARY OF THE INVENTION

It has been discovered that mechanical switches can be replaced with electronic proximity switches in order to reduce the size of switch assemblies in vehicles. It has also been discovered that electroluminescent devices or elements can be used to backlight switches to further reduce the size of switch assemblies in vehicles.

One object of the present invention is to combine a proximity switch with an electroluminescent element to reduce packaging space required for backlit switches in automotive applications.

Accordingly, in accordance with one aspect of the present invention, a light panel is provided with an outer layer, a first proximity switch, an electroluminescent element and a base portion. The outer layer includes a translucent portion. The first proximity switch is disposed beneath the outer layer and has first and second electrically conductive switch portions that are arranged to form an electric field that emanates through the outer layer when the first proximity switch is energized. The electroluminescent element is disposed beneath the outer layer to provided backlighting to the outer layer. One of the first and second electrically conductive switch portions of the first proximity switch forms at least a portion of an electrode of the electroluminescent element. The base portion is disposed beneath the electroluminescent element and the first proximity switch.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

In order to more clearly describe the various embodiments of the present invention, several terms are now defined as used herein below. The term "transparent" as used herein refers to materials through which light is easily transmitted and through which visible objects, images and graphics can easily be discerned with the naked eye. For instance, clear glass and clear plastic materials are transparent. The term "translucent" as used herein refers to materials through which light is readily transmissible, but somewhat diffused such that objects, images and graphics are discernable with some difficulty through the material. Specifically, objects, images or graphics behind a translucent material are not as easily discerned compared to visibility through transparent materials. More specifically, a translucent material can be semi-transparent, but is not as transparent as clear glass. The term "semi-translucent" as used herein refers to materials through which light is readily diffusible, but through which visible objects are generally obscured. An example of a semi-translucent material is a frosted glass through which light passes, but visible objects or images behind that material are not easily discerned by the naked eye. The shadow or outline of a visible object behind a semi-translucent material can be discerned, but the diffusion of light by the semi-translucent material obscures most if not all details of the visible object. The term "opaque" as used herein refers to materials through which light cannot pass, or materials that significantly restrict transmission or diffusion of light. The term opaque as used herein can include materials that allow some slight amount of diffusion or transmission of light, but significantly less diffusion or transmission of light than a semi-translucent material. The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

Figure 1:
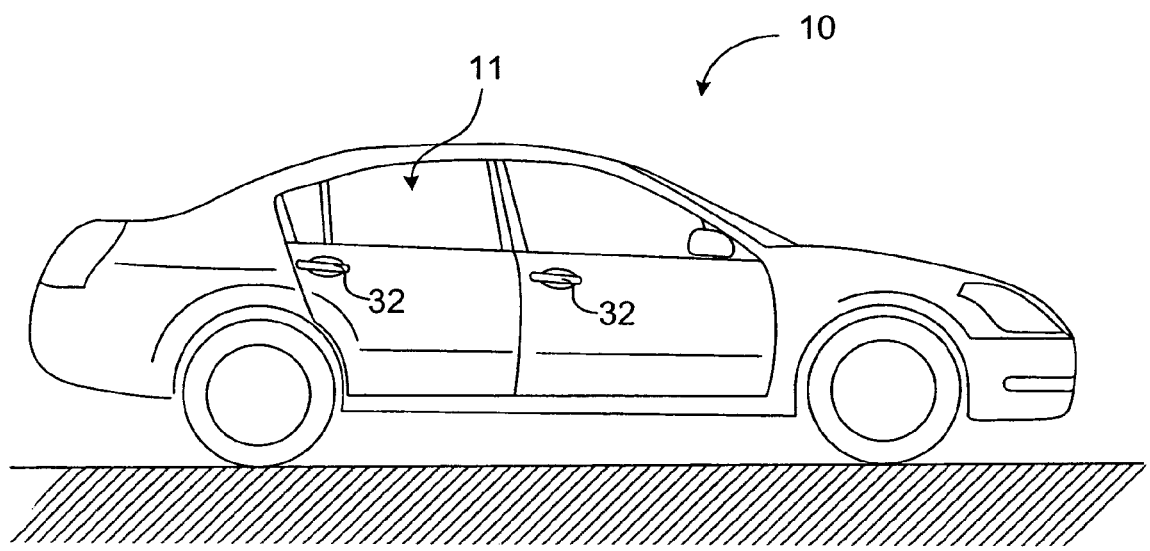
FIG. 1 is a side elevational view showing a vehicle that includes one or more light panels in accordance with the present invention.

Referring initially to FIG. 1, a vehicle 10 is illustrated in accordance with a first embodiment of the present invention.

Figure 2:
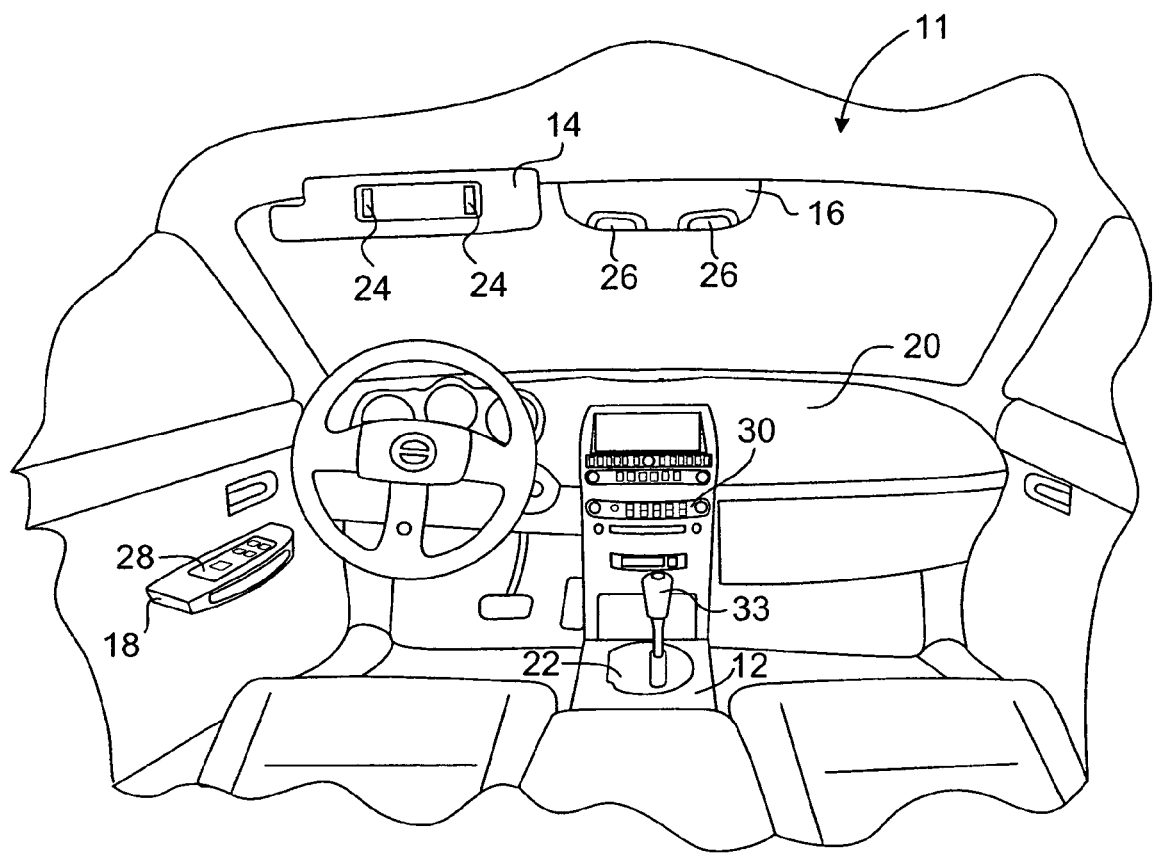
FIG. 2 is a fragmentary perspective view of the interior of the vehicle depicted in FIG. 1, showing various light panels in accordance with several embodiment of the present invention.

As shown in FIG. 2, the vehicle 10 includes a passenger compartment 11 that is provided with several light panels in accordance with a variety of embodiments of the present invention. For example, the passenger compartment 11 is fitted with a center console 12, a visor 14, a headliner console 16, a door armrest 18 and a dashboard 20. The light panels in accordance with the present invention include a shifter light panel 22 mounted to the center console 12, a plurality of mirror light panels 24 mounted to the visor 14, a plurality of map light panels 26 mounted to the headliner console 16, a switch light panel 28 mounted to the door armrest 18 and a lighted panel 30 mounted to the dashboard 20. Each of the light panels of the present invention is described below in greater detail. Further, a light panel 32 is fitted to the exterior of the vehicle 10 as a part of a door handle assembly, as described below.

First Embodiment

Figure 3:
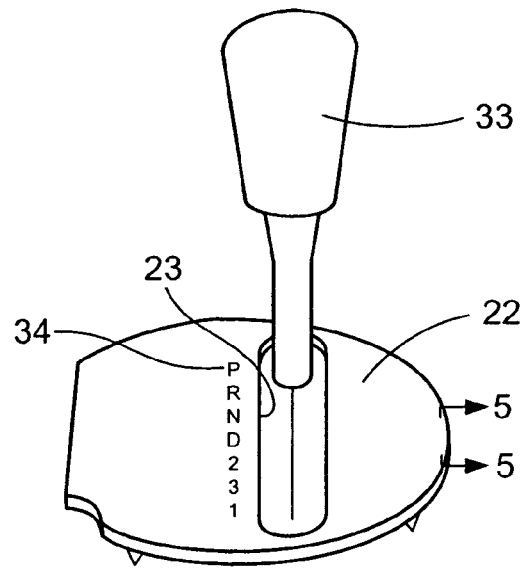
FIG. 3 is a perspective view of a shifter light panel shown removed from the vehicle, in accordance with a first embodiment of the present invention.
Figure 4:
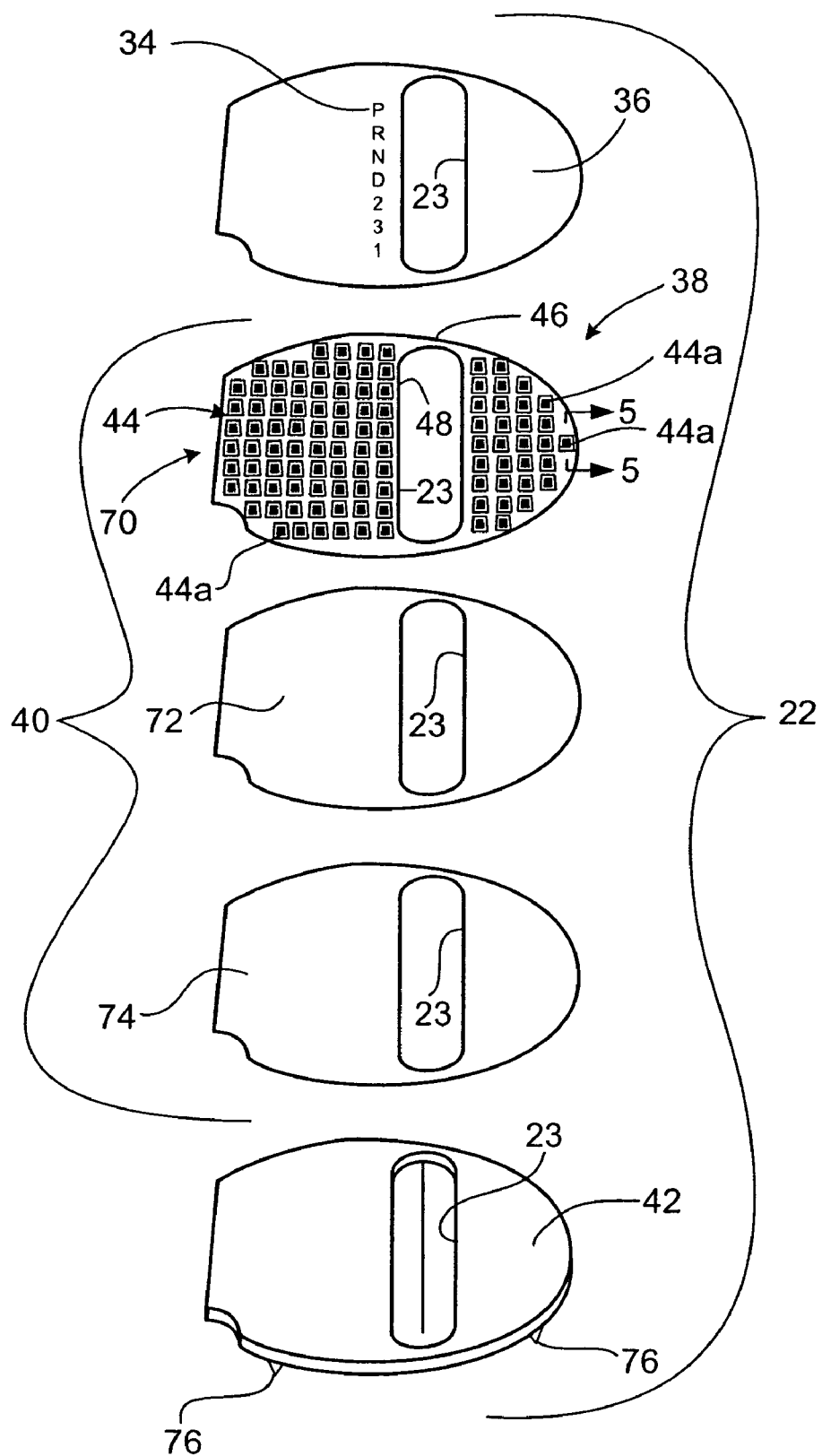
FIG. 4 is an exploded view of the shifter light panel showing the layers that define a proximity switch and an array of electroluminescent elements in accordance with the first embodiment of the present invention.
Figure 5:
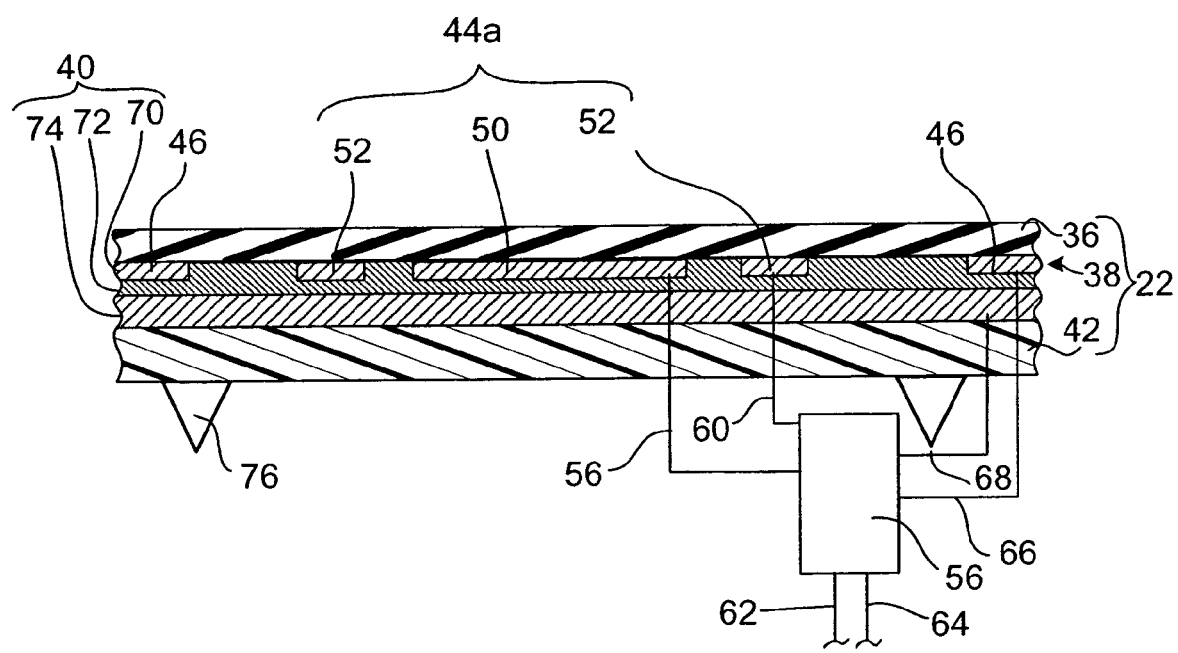
FIG. 5 is a fragmentary cross-sectional view of the shifter light panel taken along the lines 5-5 in FIG. 3 (and indicated in FIG. 4), showing the various layers and portions in accordance with the first embodiment of the present invention.

In accordance with a first embodiment of the present invention, a description of the shifter light panel 22 is now provided with specific reference to FIGS. 3, 4 and 5. The shifter light panel 22 is, for example, a transmission shifter lever cover, bezel or trim piece that at least partially forms a portion of the center console 12 in the passenger compartment 11 of the vehicle 10. The shifter light panel 22 is formed with an aperture 23 through which a transmission shifter lever 33 extends. The shifter light panel 22 includes indicia 34 adjacent to the aperture 23 that marks locations for positions of the shifter lever 33. The indicia 34 are also herein referred to as visible graphics.

The shifter light panel 22 is a multilayered unit that includes a series of layers, which each layer formed with an aperture corresponding to the aperture 23 as shown in FIG. 4. The layers of the shifter light panel 22 form both a lighting source and a switch for turning the lighting source on and off, as is described in greater detail below.

It should be understood from the drawings and the description herein that the various layers of the shifter light panel 22 depicted in FIG. 4 are depicted with thicknesses and sizes that are purely schematic and do not represent actual dimensional relationships. For example, some layers may be thicker or thinner than other layers for illustrative purposes only. The actual thickness and size of each layer depends upon design criteria and engineering considerations for the location and purpose of each lighting panel. Further, it should be understood from the drawings and description herein that the exploded layers depicted in FIG. 4 are for illustrative purposes only. Some of the layers depicted in FIG. 4 are printed or coated materials that are not necessarily separable from the adjoining layers, but are adhered there to. Therefore, the separation of layers and elements of the depiction in FIG. 4 is for the purpose of showing the separate nature of the layers which are difficult to separate once the shifter light panel 22 is manufactured.

As shown in FIGS. 4 and 5, the shifter light panel 22 basically includes an outer layer 36, a switch portion 38, an electroluminescent element 40 and a base portion 42. The outer layer 36 is preferably made of a translucent or semi-translucent material such as plastic and includes the indicia 34. The indicia 34 are preferably opaque. However, if the outer layer 36 is made of a transparent or translucent material, the indicia 34 can be printed on an under side of the outer layer 36. If the outer layer 36 is made of a semi-translucent material, the indicia 34 can be printed on an outer or exposed side of the outer layer 36.

It should be understood from the drawings and the description herein that the areas of the outer layer 36 that do not include the indicia 34 constitute a translucent portion or semi-translucent portion of the outer layer 36 thereby allowing light to diffuse from the electroluminescent element 40 into the passenger compartment 11 of the vehicle 10. Alternatively, the indicia 34 on the outer layer 36 can be translucent and the remainder of the outer layer 36 can be coated or otherwise treated to make the remainder of the outer layer opaque. Specifically, the indicia 34 can be the translucent portion of the outer layer 36 and therefore illuminated by the electroluminescent element 40 in an alternative configuration.

The switch portion 38 is preferably a layer or layers of electrically conductive translucent material(s) printed or otherwise provided onto the underside of the outer layer 36. For example, the switch portion 38 can be printed using known printing techniques or a conductive layer of material can be applied to the underside of the outer layer 36 and unnecessary areas etched or otherwise removed from the outer layer 36 to form the switch portion 38.

The switch portion 38 includes an array of proximity switches 44 and a pair of conductive portions 46 and 48, as shown in FIG. 4. The array of proximity switches 44 includes a plurality of small proximity switches 44a that work in concert as a single switch to turn the electroluminescent element 40 on and off, as is described in greater detail below. The conductive portions 46 and 48 are not necessarily part of the array of proximity switches 44, as described further below.

FIG. 5 shows one of the small proximity switches 44a that make up the array of proximity switches 44. Each of the small proximity switches 44a of the array of proximity switches 44 includes a first electrically conductive switch portion 50 and a second electrically conductive switch portion 52. Both the first electrically conductive switch portion 50 and the second electrically conductive switch portion 52 are translucent. The first electrically conductive switch portions 50 in the array of proximity switches 44 are electrically separated and spaced apart from the second electrically conductive switch portions 52.

As mentioned above, the first and second electrically conductive switch portions 50 and 52 can be printed directly to the underside of the outer layer 36 at the same time. However it should be understood from the drawings and the description herein that the first electrically conductive switch portions 50 can be printed separately from the second electrically conductive switch portions 52. Further, the first electrically conductive switch portions 50 can be coated with an electrically insulating coating prior to printing of the second electrically conductive switch portions 52 to ensure electrical separation thereof. Likewise, the second electrically conductive switch portions 52 can be coated with an electrically insulating coating prior to printing of the first electrically conductive switch portions 50 to ensure electrical separation therefrom.

Each of the proximity switches 44a of the array of proximity switches 44 operates in generally the same manner. Therefore description below of one proximity switch applies to all the proximity switches 44a within the array of proximity switches 44.

A single set of the first and second electrically conductive switch portions 50 and 52 is shown diagrammatically in FIGS. 6, 7 and 8 to demonstrate the operation of the proximity switch 44a and each of the proximity switches in the various embodiments described below.

Figure 6:
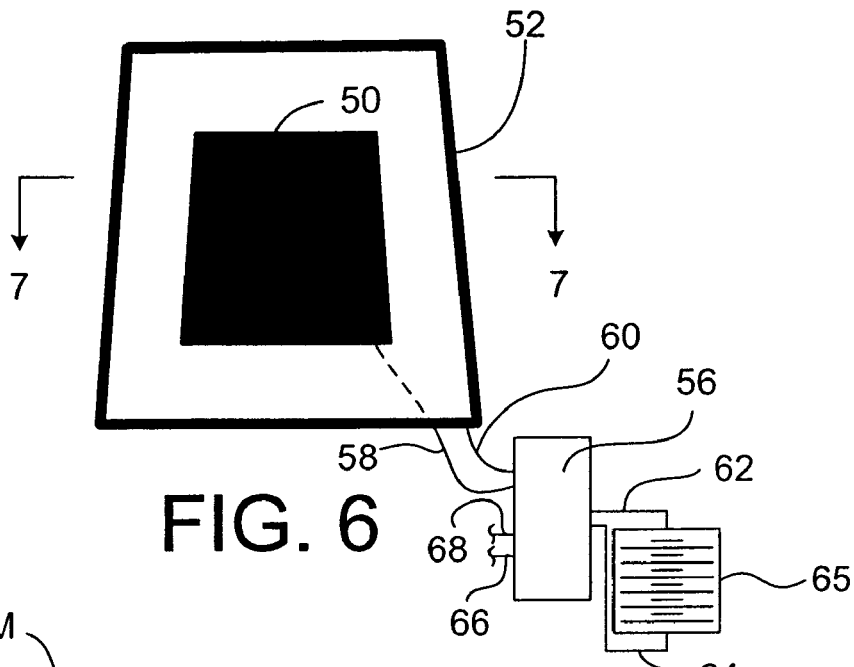
FIG. 6 is a schematic view of a proximity switch in accordance with each of the embodiments the present invention.

As shown in FIG. 6, the second switch portion 52 surrounds the first switch portion 50 but is spaced apart therefrom. In FIG. 6, the proximity switch 44a is depicted with a generally square or rectangular shape. It should be understood that each proximity switch 44a can alternatively have a circular shape. Further, the proximity switches 44a can be formed by rows of side by side elongated conductive strips that are electrically separated and spaced apart from one another.

Figure 7:
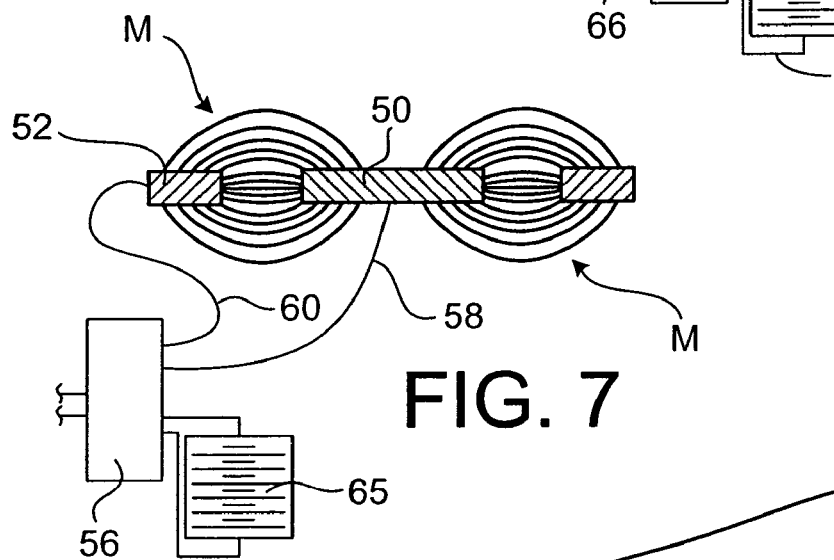
FIG. 7 is a schematic cross sectional side view of the proximity switch depicted in FIG. 6 showing magnetic lines of force generated when the proximity switch is activated in accordance with each of the embodiments of the present invention.
Figure 8:
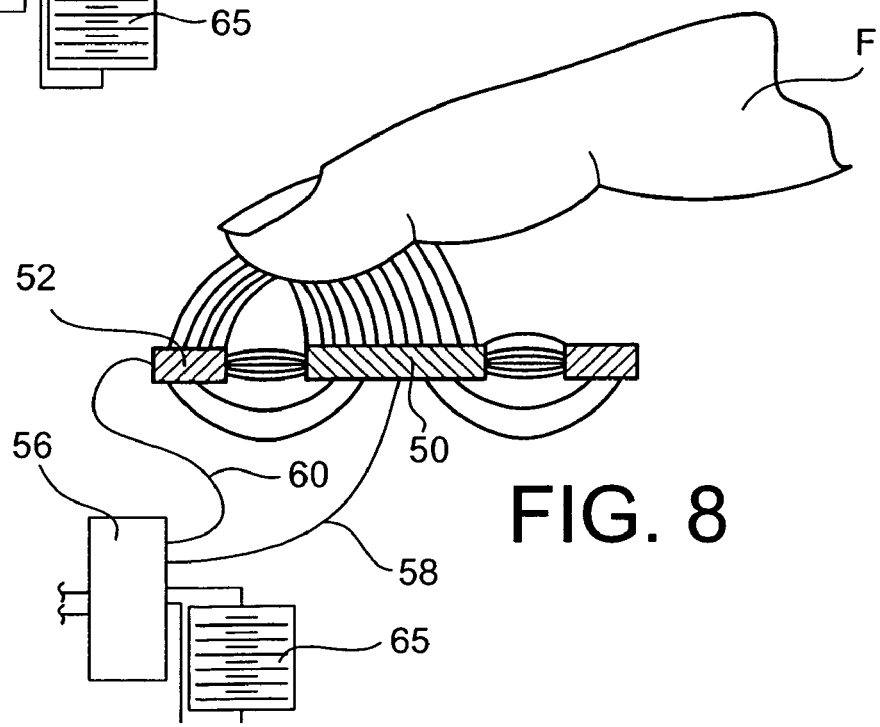
FIG. 8 is a schematic cross sectional side view of the proximity switch depicted in FIGS. 6 and 7 showing magnetic lines of force disturbed by the proximity of a human finger in accordance with each of the embodiments of the present invention.

The first and second electrically conductive switch portions 50 and 52 are connected to a controller 56 by power lines 58 and 60, respectively as shown in FIGS. 6, 7 and 8. The controller 56 is supplied with DC electricity by power lines 62 and 64 from, for example, a battery 65 within the vehicle 10. The controller 56 includes conventional circuitry (not shown) that converts the DC electricity to AC electricity. The controller 56 is also provided with power lines 66 and 68 that are connected to the electroluminescent element 40 (as described further below).

It should be understood from the drawings and the description herein that in the first embodiment of the present invention the power lines 58 and 60 are connected to every one of the first and second electrically conductive switch portions 50 and 52, respectively, of all the proximity switches 44a in the array of proximity switches 44. Therefore, the array of proximity switches 44 acts as a single switch. Further, for one or more of the proximity switches 44a, at least a portion of the first and second electrically conductive switch portions 50 and 52 are applied on the outer layer 36 to at least partially coincide with the translucent portion. Further, at least a portion of one or more of the first electrically conductive switch portions 50 is at least partially disposed directly beneath the indicia 34 (the visible graphic).

The proximity switch 44 operates as follows. When activated by a supply of AC power from the controller 56, the electric potential between the second switch portion 52 and the first switch portion 50 creates a magnetic field M indicated in FIG. 7. The controller 56 includes conventional attenuated circuitry and/or programming that detect fluctuations in the magnetic field M resulting from proximity or touch of a human finger F, as indicated in FIG. 8. Once the controller 56 detects a disturbance in the magnetic field M, such as that depicted in FIG. 8, the electroluminescent element 40 is supplied with power, thereby causing it to illuminate.

Figure 9:
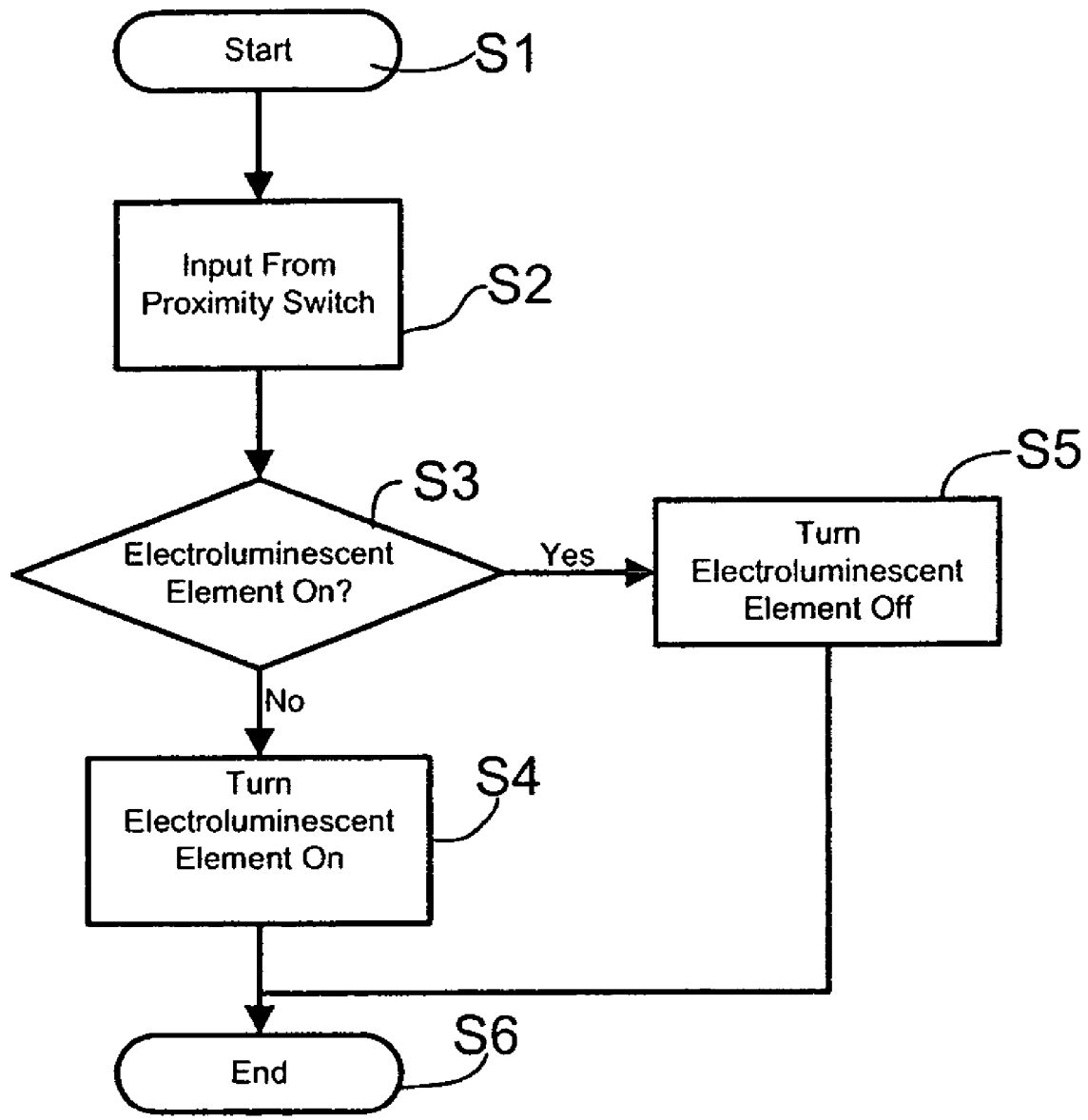
FIG. 9 is a flowchart showing various operational steps executed by a controller connected to the proximity switch in the shifter light panel depicted in FIGS. 3, 4 and 5 in accordance with the first embodiment of the present invention.

The controller 56 operates as follows, as shown in FIG. 9. As step S1, power is provided to the controller 56, for example, when the vehicle 10 is operating or when the ignition switch (not shown) is turned on. The controller 56 supplies power to each of the proximity switches 44a such that each of the proximity switches 44a in the array of proximity switches 44 generates the magnetic fields M depicted in FIG. 7. The controller 56 senses for any activity in any one or any group of the proximity switches 44a in the array of proximity switches 44. At step S2 in FIG. 9, the controller senses an input from one or more of the proximity switches 44a, for example, a disturbance by the finger F (FIG. 8) of a passenger or driver within the vehicle 10 is such an input. At a decision step S3, the controller 56 determines whether or not the electroluminescent element 40 is illuminated or not (on or off). If the electroluminescent element 40 is off, then the controller 56 turns the electroluminescent element 40 on, as indicated at step S4. If the electroluminescent element 40 is on, then the controller 56 turns the electroluminescent element 40 off, as indicated at step S5. At step S6, the controller 56 ends by, for example, returning to step S1 and waits for subsequent input from the array of proximity switches 44.

The controller 56 is configured to sense magnetic field perturbations in any one of the proximity switches 44a, or any group of the proximity switches 44a of the array of proximity switches 44. Consequently, a driver or passenger of the vehicle 10 can touch the shifter light panel 22 or bring their finger F in close proximity to the shifter light panel 22 and cause the electroluminescent element 40 to either illuminate or stop illuminating (turn on or turn off). The proximity or touch of the finger F can be anywhere on the shifter light panel 22.

The electroluminescent element 40 is now described in greater detail with reference to FIGS. 4 and 5. The electroluminescent element 40 is disposed beneath the outer layer 36 to provided backlighting to the outer layer_36. More specifically, the electroluminescent element 40 provides illumination to highlight the indicia 34 printed on the outer layer.

As shown in FIG. 5, the electroluminescent element 40 includes a first electrode 70, phosphor and dielectric materials 72, and a second electrode 74, with the phosphor and dielectric materials 72 disposed between the first and second electrodes 70 and 74. In the first embodiment, the first electrode 70 is formed by some or all of the first electrically conductive switch portions 50 of each proximity switch 44a within the array or proximity switches 44, and the conductive portions 46 and 48. As shown in FIG. 5, the conductive portion 46 (and 48) is connected to the power line 66. The first electrically conductive switch portions 50 can be connected to the power line 66 (not shown) or, are preferably connected to the power line 66 via circuitry within the controller 56 in order to serve as part of the first electrode 70 of the electroluminescent element 40. Therefore, a portion of each proximity switch 44a of the array of proximity switches 44 acts as a part of the first electrode 70.

The phosphor and dielectric materials 72 are depicted as a single layer in FIGS. 4 and 5 but are preferably separate layers with the phosphor separate from the dielectric material. Alternatively, the phosphor and dielectric materials 72 can be a single layer that includes a mixture of the two materials.

The second electrode 74 is preferably a conductive layer of metallic material. The second electrode 74 can include any of a variety of electrically conductive materials. Preferably the second electrode 74 includes a material that has a high amount of reflectivity in order to maximize the light emitted from the electroluminescent element 40. As shown in FIG. 5, the second electrode 74 is connected to the power line 68.

The electroluminescent element 40 works in a conventional manner. Specifically, when the controller 56 switches on the electroluminescent element 40, AC current is provided to the power lines 66 and 68. The fluctuating magnetic fields generated between the first and second electrodes 70 and 74, excites the phosphor causing it to produce light.

The base portion 42 is disposed beneath the electroluminescent element 40 and the array of proximity switches 44. The base portion 42 includes attachment portions 76. The attachment portions 76 are shown schematically in the drawings, but can be snaps, clips, springs, apertures for receiving fasteners, or fasteners that attach to corresponding attachment receiving members (not shown) formed in center console 12 in the vehicle 10.

The base portion 42 is depicted in FIGS. 4 and 5 as having a thickness greater that the outer layer 36, the switch portion 38 and the electroluminescent element 40. Preferably, the base portion 42 is thicker in order to provide a generally rigid support for the switch portion 38. The base portion 42 preferably has a shape corresponding to the outer layer 36.

Although the shifter light panel 22 is depicted as having a generally planar shape, the shifter light panel 22 can be provided with a three dimensional profile. For instance the shifter light panel 22 can have a curved contour to blend in with the adjacent shapes and contours of the center console 12 in the passenger compartment 11. Further, the shifter light panel 22 and the various portions that make up the shifter light panel 22 are depicted with a somewhat round shape. It should be understood from the drawings and description herein that the shifter light panel 22 can be formed in any of a variety of shapes. Specifically, the shifter light panel 22 can also be formed with a square or rectangular shape. Alternatively, the shifter light panel 22 can be formed with an elliptical or oblong shape to suit the design criteria of the center console 22. The depicted shape of the shifter light panel 22 is merely one example of a variety of possible shapes.

The mirror light panels 24 and the map light panels 26 are similar to the shifter light panel 22 except that the mirror light panels 24 and the map light panels 26 are not necessarily provided with the indicia 34. The mirror light panels 24 and the map light panels 26 are constructed and operated in generally the same manner as the shifter light panel 22. For instance, the mirror light panels 24 and the map light panels 26 include the array of proximity switches 44. The driver or passenger within the passenger compartment 11 touches either the mirror light panels 24 or the map light panels 26 and they turn on if they are off, or turn off if they are on. Since the mirror light panels 24 and the map light panels 26 are provided to give off an appreciable amount of light, the mirror light panels 24 and the map light panels 26 are constructed with more transparent materials to maximize the amount of light emitted by their respective electroluminescent elements 40. As indicated in FIG. 2, the mirror light panels 24 are generally flat and are located on either side of a mirror in the visor 14. However, the map light panels 26 are formed with a three dimensional surface profile or contoured shape to blend in with the shape of the headliner console 16.

Since the construction and operation of the mirror light panels 24 and the map light panels 26 are generally the same as the shifter light panel 22, further description is omitted for the sake of brevity.

It should be appreciated that light panels, such as the shifter light panel 22, the mirror light panels 24 and the map light panels 26 constructed in accordance with the first embodiment of the present invention, can be molded and shaped to fit many different engineering and automotive applications and are not confined to the shapes and relative sizes depicted in FIGS. 2-5.

Second Embodiment

Figure 10:
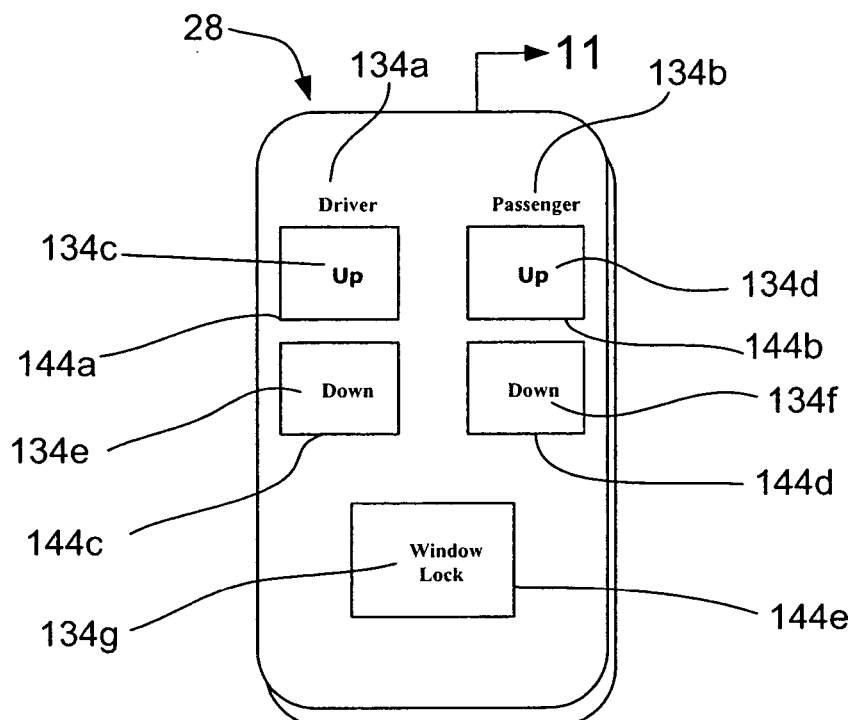
FIG. 10 is a perspective view of a switch light panel in accordance with a second embodiment of the present invention.

Referring now to FIG. 10, the switch light panel 28 in accordance with a second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity. The parts of the second embodiment that differ from the parts of the first embodiment will be indicated with a single prime (') or a new reference numeral.

The switch light panel 28 is, for example, a window control panel that controls the operation of driver and passenger side windows. The switch light panel 28 includes seven separate areas of indicia 134a through 134g (visible graphics). Indicia 134a and 134b are headings that identify driver and passenger switch areas of the switch light panel 28. The indicia 134c through 134g overlay separate proximity switches 144a through 144e and indicate the function of each of the proximity switches 144a through 144e, as described in greater detail below. It should be understood from the drawing and the description of the invention that the number of switches on the switch light panel 28 is variable. Five proximity switches 144a through 144e are depicted for illustrative purposes only. For example, rear seat up and down window switches can also be added to the switch light panel 28.

Figure 11:
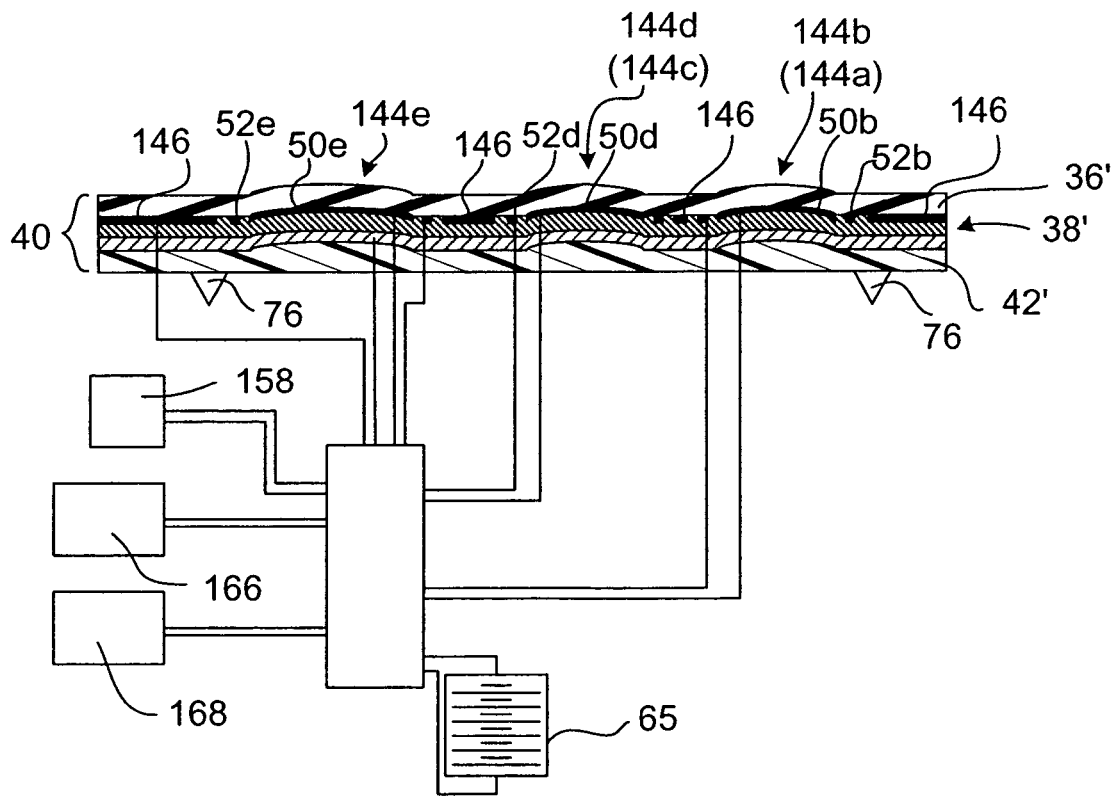
FIG. 11 is a cross-sectional side view of the switch light panel depicted in FIG. 10 in accordance with the second embodiment of the present invention.
Figure 12:
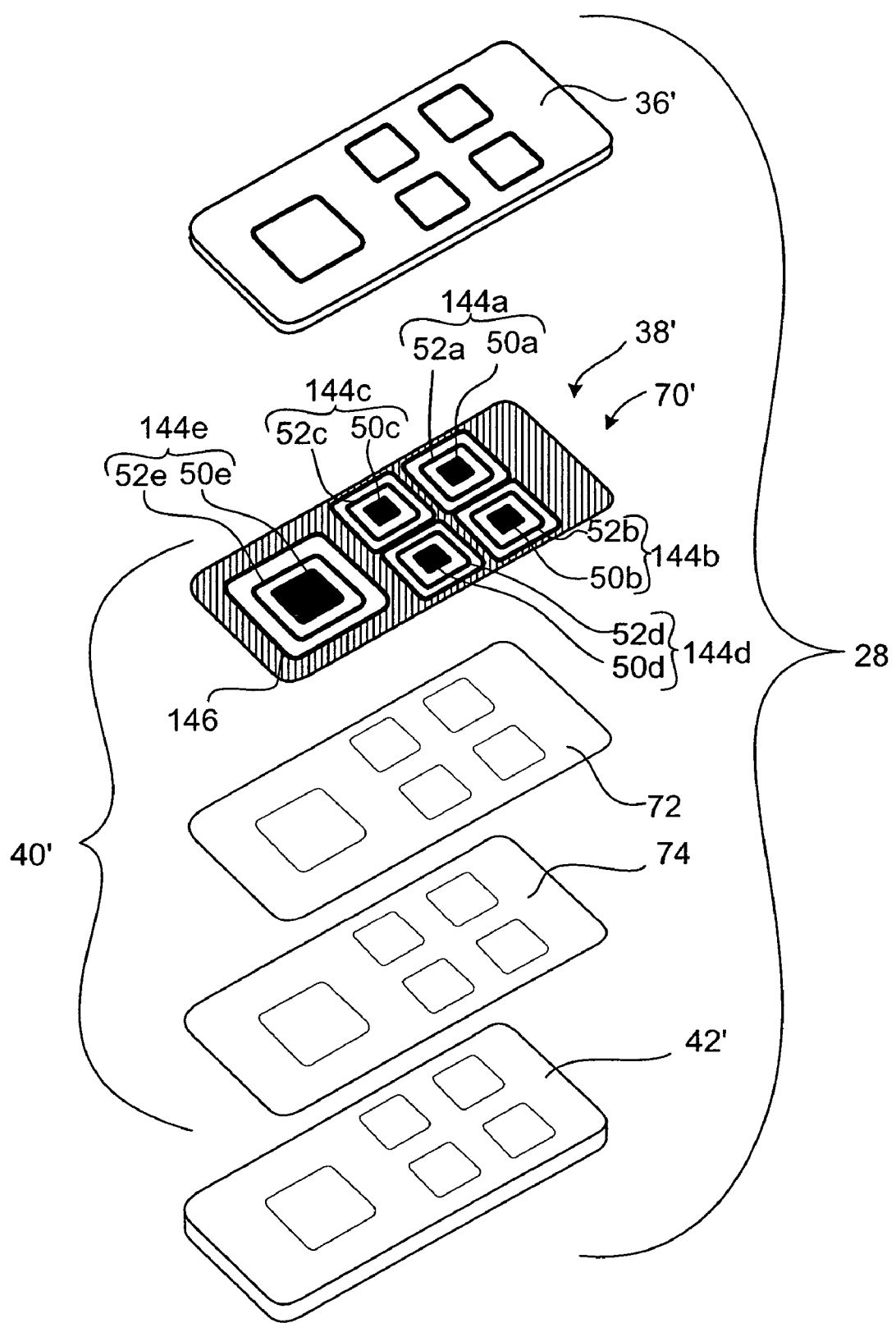
FIG. 12 is an exploded of the switch light panel depicted in FIGS. 10 and 11, in accordance with the second embodiment of the present invention.

As shown in FIGS. 11 and 12, the switch light panel 28 basically includes an outer layer 36', a switch portion 38', an electroluminescent element 40' and a base portion 42'. The outer layer 36' is preferably made of a translucent or semi-translucent material such as plastic and includes the indicia 134a through 134g printed thereon. The indicia 134a through 134g are preferably opaque. If the outer layer 36' is made of a translucent material, the indicia 134a through 134g can be printed on an under side of the outer layer 36'. If the outer layer 36' is made of a semi-translucent material, the indicia 134a through 134g can be printed on an outer or exposed side of the outer layer 36'. The outer layer 36' generally differs from the outer layer 36 of the first embodiment in size and shape and also lacks the aperture formed in the outer layer 36.

The electroluminescent element 40' and a base portion 42' are similar to the electroluminescent element 40 and the base portion 42 of the first embodiment except that their shape and use differs from the shifter light panel 22 and they include no apertures. The description of the electroluminescent element 40 and the base portion 42 of the first embodiment is generally applicable to the electroluminescent element 40' and the base portion 42' of the second embodiment. For instance, the base portion 42' includes attachment portions 76. Therefore, for the sake of brevity and to avoid repetition, description is provided for only those features of the electroluminescent element 40' and a base portion 42' in the second embodiment that differ from the first embodiment.

One of the differences between the first and second embodiments is as follows. In the second embodiment, each of the outer layer 36', the switch portion 38', electroluminescent element 40' and the base portion 42' are formed with three dimensional surface profiles. Specifically, in the region around each of the proximity switches 144a through 144e, a protrusion or raised area is formed in the switch light panel 28, one raised area for each of the proximity switches 144a through 144e, as indicated in FIG. 11.

The switch portion 38' differs from the switch portion 38 of the first embodiment in that the plurality of separate proximity switches 144a through 144e of the switch portion 38' are printed or otherwise provided on the underside of the outer layer 36'. Each of the proximity switches 144a through 144e includes first electrically conductive switch portions 50a through 50e, and second electrically conductive switch portions 52a through 52e, respectively, as indicated in FIGS. 11 and 12. The switch portion 38' is further provided with a conductive portion 146 that surrounds the proximity switches 144a through 144e but is electrically separated or insulated therefrom. The conductive portion 146 and each of the first electrically conductive switch portions 50a through 50e of the proximity switches 144a through 144e serves as a first electrode 70' of the electroluminescent element 40'.

Each of the proximity switches 144a through 144e works separately and independently from one another. More specifically, the proximity switches 144a through 144e do not form an array of switches, unlike the array of proximity switches 44 in the first embodiment. Each of the proximity switches 144a through 144e operates separately and independently of each other, as is explained in greater detail below.

As shown in FIG. 11, each of the proximity switches 144a through 144e is connected to a controller 156. The controller 156 is further connected to a remote switch 158, a driver's side window motor 166, a passenger side window motor 168 and a power source, such as the battery 65. The driver's side window motor 166 and the passenger side window motor 168 are remote devices controlled by the controller 156 in response to inputs from the proximity switches 144a through 144e.

In the second embodiment, the remote switch 158 sends a signal to the controller 156 which then turns the electroluminescent element 40' on or off. The remote switch 158 can be any of a variety of passenger operated switches within the vehicle 10, or any combination of switches. For example, the remote switch 158 can be a door jam switch (not shown) that turns the electroluminescent element 40' on when a vehicle door is open and off when the door is shut. Similarly, the remote switch 158 can be a headlamp switch (not shown) that turns the electroluminescent element 40' on and off along with headlights on the vehicle 10. As well, the remote switch 158 can be an interior light switch (not shown) that turns the electroluminescent element 40' on and off along with interior lights within the vehicle 10.

The controller 156 is configured such that when the proximity switch 144a is pressed, the controller 156 operates the driver's side window motor 166 to raise the window. When the proximity switch 144c is pressed, the controller 156 operates the driver's side window motor 166 lower the window. Similarly, when the proximity switch 144b is pressed, the controller 156 operates the passenger's side window motor 168 to raise the window. When the proximity switch 144d is pressed, the controller 156 operates the passenger's side window motor 168 lower the window. Lastly, when the proximity switch 144e is pressed, the controller 156 locks both the driver's side and the passenger's side window motors 166 and 168 thereby preventing their operation. Similarly, if the windows are locked, when the proximity switch 144e is pressed, the controller 156 unlocks them allowing the operation of both the driver's side and the passenger's side window motors 166 and 168.

It should be understood from the drawings and the description herein that each of the proximity switches 144a through 144e operates independently from one another in accordance with the description provided above in FIGS. 6, 7 and 8 with respect to a single switch, such as one of the proximity switches 44a. Specifically, when a passenger's finger is close to or touches one of the proximity switches 144a through 144e, the magnetic field generated between respective pairs of the first electrically conductive switch portions 50a through 50e and second electrically conductive switch portions 52a through 52e provides an input to the controller 156. The controller 156 includes circuitry or control logic programming that enables the controller 156 to distinguish an input from of the proximity switches 144a through 144e.

Figure 13:
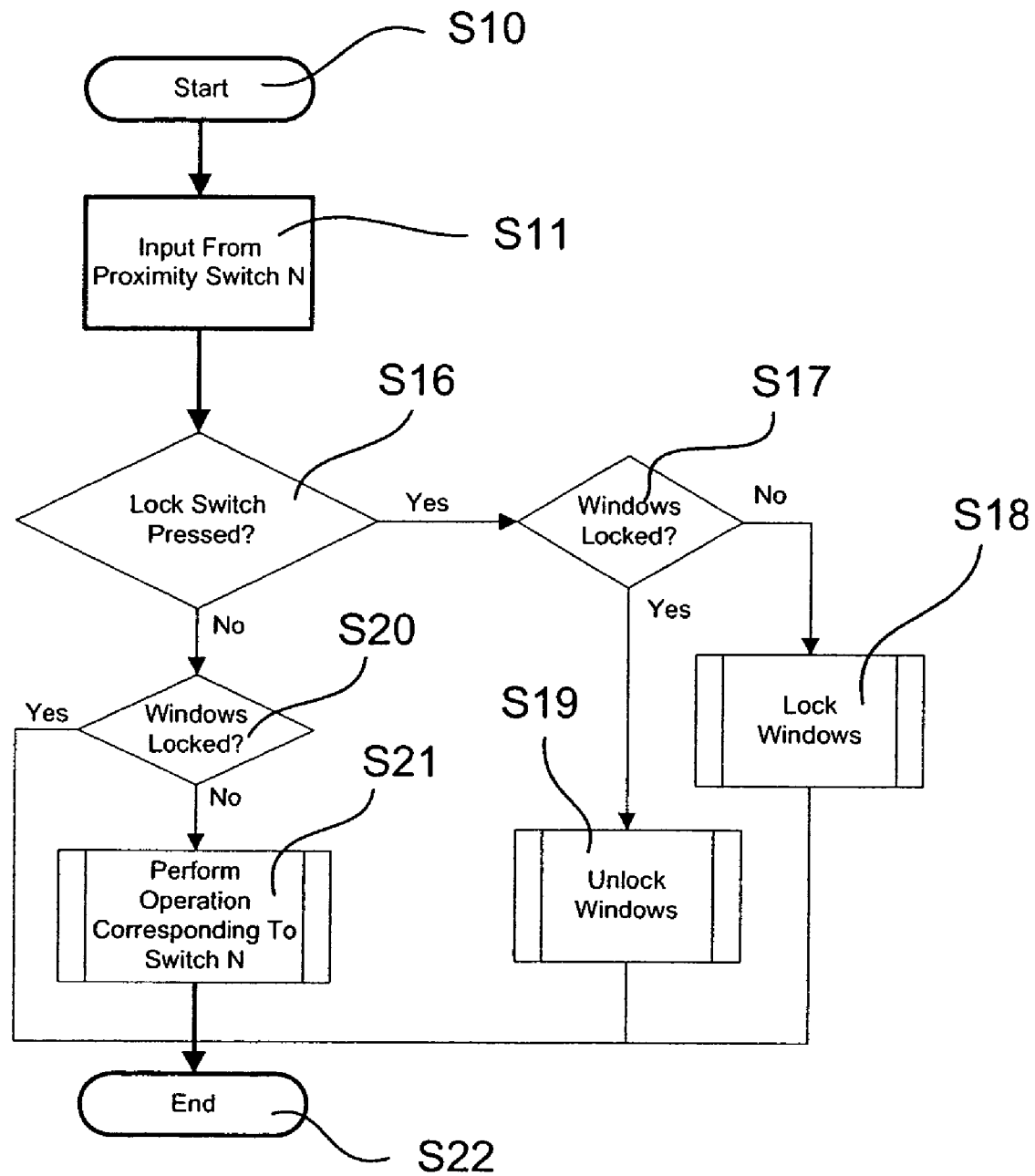
FIG. 13 is a flowchart showing various operational steps executed by a controller connected to proximity switches in the switch light panel depicted in FIGS. 10, 11 and 12, in accordance with the second embodiment of the present invention.

FIG. 13 is a flowchart outlining the basic functions of the controller 156. In response to detection of finger proximity or finger contact with any of the proximity switches 144a through 144e of the switch light panel 28 a specific operation is performed. At step S10 in FIG. 13, the controller 156 is provided with power from the battery 65 (FIG. 11). The controller 156 activates each of the proximity switches 144a through 144e. Specifically, a magnetic field is created between respective pairs of the first electrically conductive switch portions 50a through 50e and the second electrically conductive switch portions 52a through 52e. At step S11, the controller 156 senses an input (contact or finger proximity) from proximity switch N, where N is one of the proximity switches 144a through 144e. At step S16, the controller 156 determines whether or not proximity switch 144e has been pressed or not. The proximity switch 144e corresponds to locking and unlocking the windows. If the proximity switch 144e has been pressed, at step S17 the controller determines whether or not the windows are in a locked state or an unlocked state. If the windows are not locked, at step S18 operation of the windows is put in a locked status and the windows do not operate. In step S17, if the windows are in the locked state, then at step S19 the controller 156 unlocks the windows (puts them in an unlocked state) and allows them to operate in response to future proximity switch inputs.

In step S16, if the controller 156 determines that a proximity switch other than the proximity switch 144e has been pressed, then at step S20 a determination is made concerning the locked state of the windows. If the windows are in the locked state, then no action is taken.

At step S20, if the windows are not in the locked state, then at step S21 the action corresponding to the proximity switch N is executed. Specifically, if an input is received by the controller 156 from the proximity switch 144a, then the driver's side window motor 166 is operated to raise the driver's side window. If an input is received by the controller 156 from the proximity switch 144c, then the driver's side window motor 166 is operated to lower the driver's side window. Similarly, if an input is received by the controller 156 from the proximity switch 144b, then the passenger's side window motor 168 is operated to raise the passenger's side window. If an input is received by the controller 156 from the proximity switch 144d, then the passenger's side window motor 168 is operated to lower the passenger's side window.

At step S22, the controller 156 returns to step S10 and awaits further proximity switch input.

Third Embodiment

Figure 14:
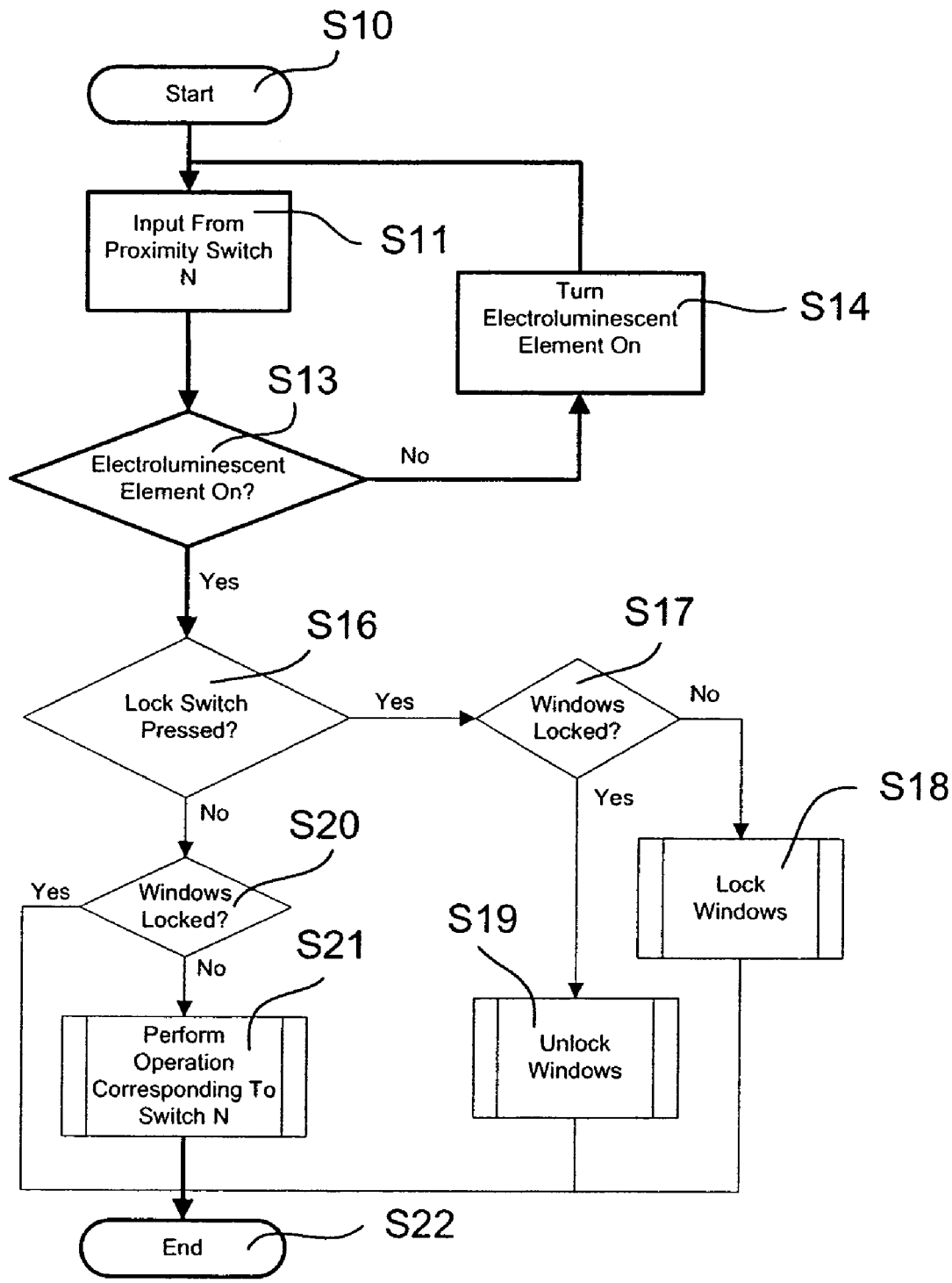
FIG. 14 is a flowchart showing various operational steps executed by a controller connected to proximity switches in the switch light panel depicted in FIGS. 10, 11 and 12, in accordance with the third embodiment of the present invention.

Referring now to FIG. 14, a flowchart is shown demonstrating operation of the switch light panel 28 in accordance with a third embodiment of the present invention will now be explained. In view of the similarity between the second and third embodiments, the parts of the third embodiment that are identical to the parts of the second embodiment will be given the same reference numerals as the parts of the second embodiment. Moreover, the descriptions of the parts of the third embodiment that are identical to the parts of the second embodiment may be omitted for the sake of brevity.

In the third embodiment, the controller 156 of the second embodiment can be configured to operate in a manner slightly different that shown in FIG. 13.

Specifically, as shown in FIG. 14, the controller 156 of the third embodiment is programmed to turn on the electroluminescent element 40' in response to input from any one of the proximity switches 144a through 144e.

For instance, as indicated in step S13 in FIG. 14, in response to an input from any one of the proximity switches 144a through 144e the controller 156 first determines whether or not the electroluminescent element 40' is on or not. If the electroluminescent element 40' is not on (not illuminated) then at step S14, the electroluminescent element 40' is turned on. The controller 156 then awaits further input from any one of the proximity switches 144a through 144e. In step S13, if the electroluminescent element 40' is already illuminated, then the controller 156 proceeds to step S16 and operations of the controller 156 continue in a manner generally the same as in the second embodiment. Steps S16 through S22 in the third embodiment are generally the same as in the second embodiment. Therefore to avoid repetition, description of steps S16 through S22 is omitted.

Fourth Embodiment

Figure 15:
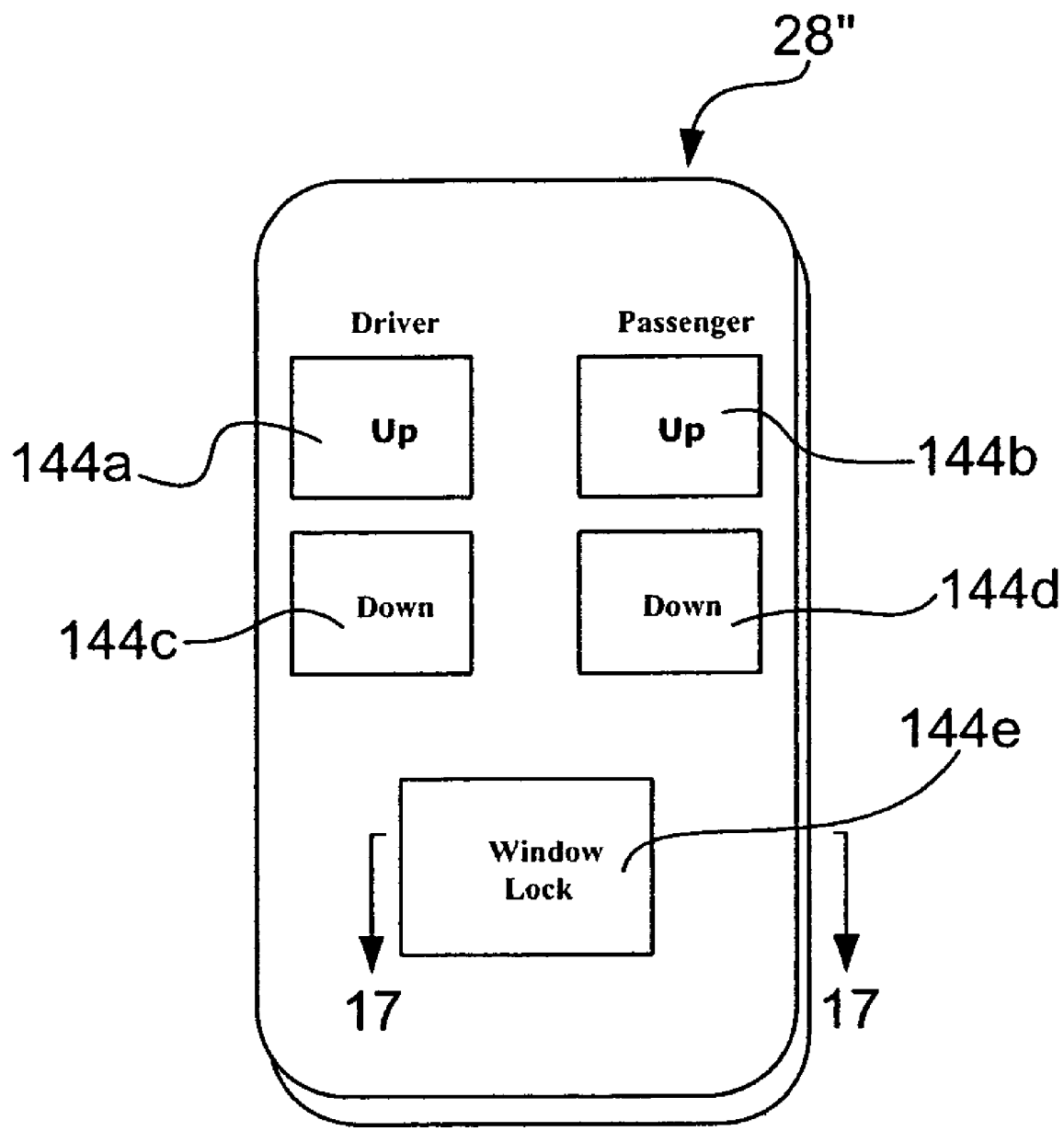
FIG. 15 is a perspective view of a switch light panel in accordance with a fourth embodiment of the present invention.
Figure 16:
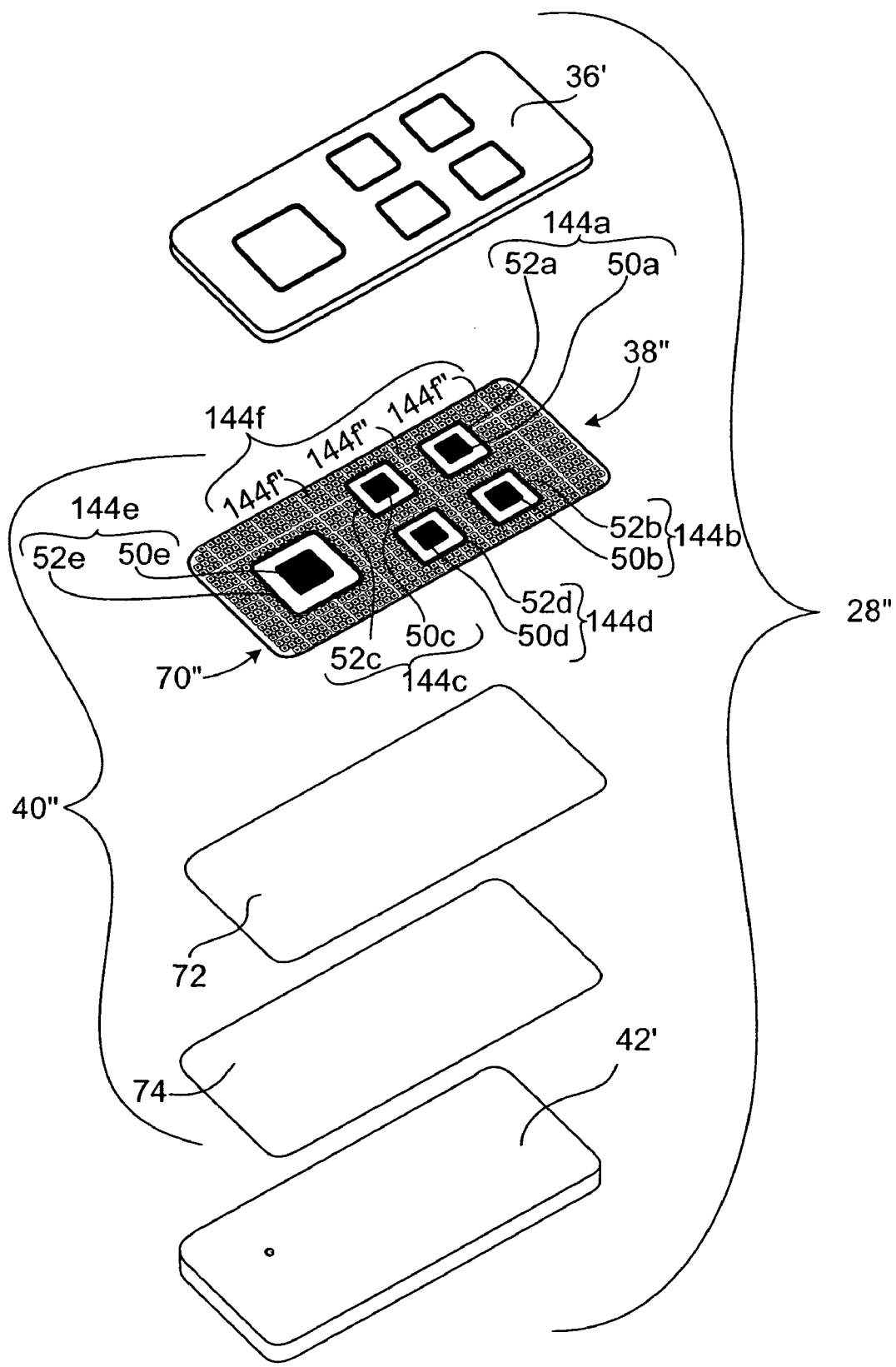
FIG. 16 is an exploded of the switch light panel depicted in FIG. 15, in accordance with the fourth embodiment of the present invention.
Figure 17:
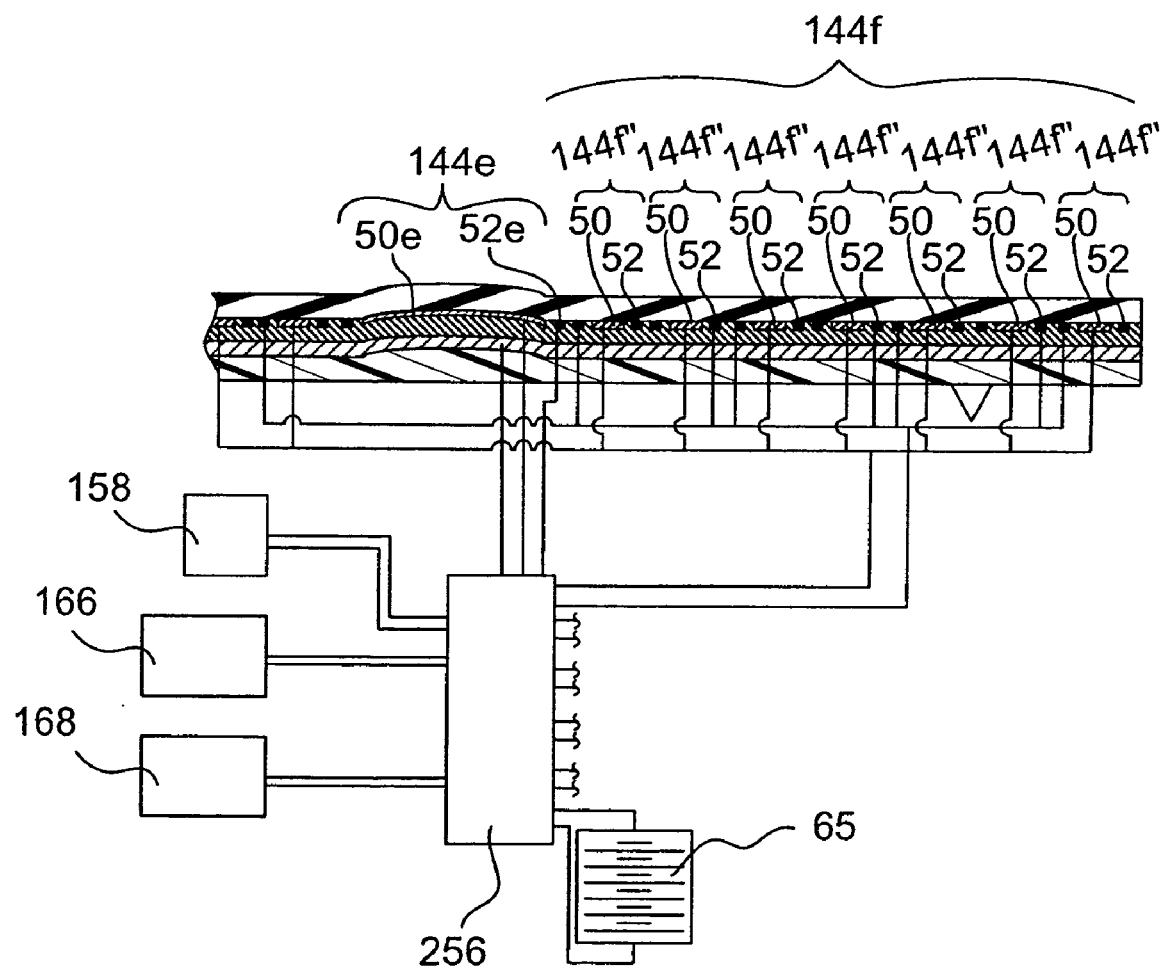
FIG. 17 is a fragmentary cross-sectional side view of the switch light panel depicted in FIGS. 15 and 16 in accordance with the fourth embodiment of the present invention.

Referring now to FIGS. 15, 16 and 17, a switch light panel 28" in accordance with a fourth embodiment will now be explained. In view of the similarity between the second and fourth embodiments, the parts of the fourth embodiment that are identical to the parts of the second embodiment will be given the same reference numerals as the parts of the second embodiment. Moreover, the descriptions of the parts of the fourth embodiment that are identical to the parts of the second embodiment may be omitted for the sake of brevity. The parts of the fourth embodiment that differ from the parts of the second embodiment will be indicated with a double prime (") or a new reference numeral.

As shown in FIG. 16, the switch light panel 28" basically includes the outer layer 36', a switch portion 38", an electroluminescent element 40" and the base portion 42'. The switch light panel 28" in the fourth embodiment of the present invention includes the switch portion 38" and the electroluminescent element 40" that differ from the switch portion 38' and the electroluminescent element 40' of the second embodiment. The outer layer 36' and base portion 42' are generally unchanged.

In the fourth embodiment, the switch portion 38" includes the plurality of separate proximity switches 144a through 144e of the second embodiment, but also includes an array of proximity switches 144f in the areas surrounding the proximity switches 144a through 144e. The proximity switches 144a through 144e include respective pairs of the first electrically conductive switch portions 50a through 50e and the second electrically conductive switch portions 52a through 52e.

The array of proximity switches 144f is provided in the same regions of the switch portion 38" as the conductive portion 146 in the switch portion 38' of the second embodiment. In other words, the conductive portion 146 of the third embodiment is eliminated in the fourth embodiment and replaced with the array of proximity switches 144f.

The array of proximity switches 144f includes a plurality of small proximity switches 144f', as indicated in FIGS. 16 and 17. Each small proximity switch 144f' includes respective first and second electrically conductive switch portions 50 and 52, as indicated in FIG. 17. It should be understood from the drawing and the description herein that the array of proximity switches 144f is similar to the array of proximity switches 44 of the first embodiment. Similarly, the small proximity switches 144f' are similar to the small proximity switches 44a of the first embodiment.

The electroluminescent element 40" differs from the electroluminescent element 40' of the second embodiment in that an electrode 70" of the electroluminescent element 40" of the fourth embodiment is defined by the first electrically conductive switch portions 50a through 50e of each of the proximity switches 144a through 144e and additionally the first electrically conductive switch portions 50 of each of the small proximity switches 144f' in the array of proximity switches 144f.

In the fourth embodiment, the array of proximity switches 144f serves as an on off switch for turning on and off the electroluminescent element 40". Specifically, when a finger comes close to or touches any portion of the array of proximity switches 144f, the electroluminescent element 40" is turned on or off.

As shown in FIG. 17, each of the proximity switches 144a through 144e, the array of proximity switches 144f and the electroluminescent element 40" is connected to a controller 256. The controller 256 is programmed or configured to perform all the operations of the controller 156. Additionally, the controller 256 detects whether or not one or a group of the small proximity switches 144*f″* of the array of proximity switches 144*f* has provided an input or not to turn on or off the electroluminescent element 40″.

Figure 18:
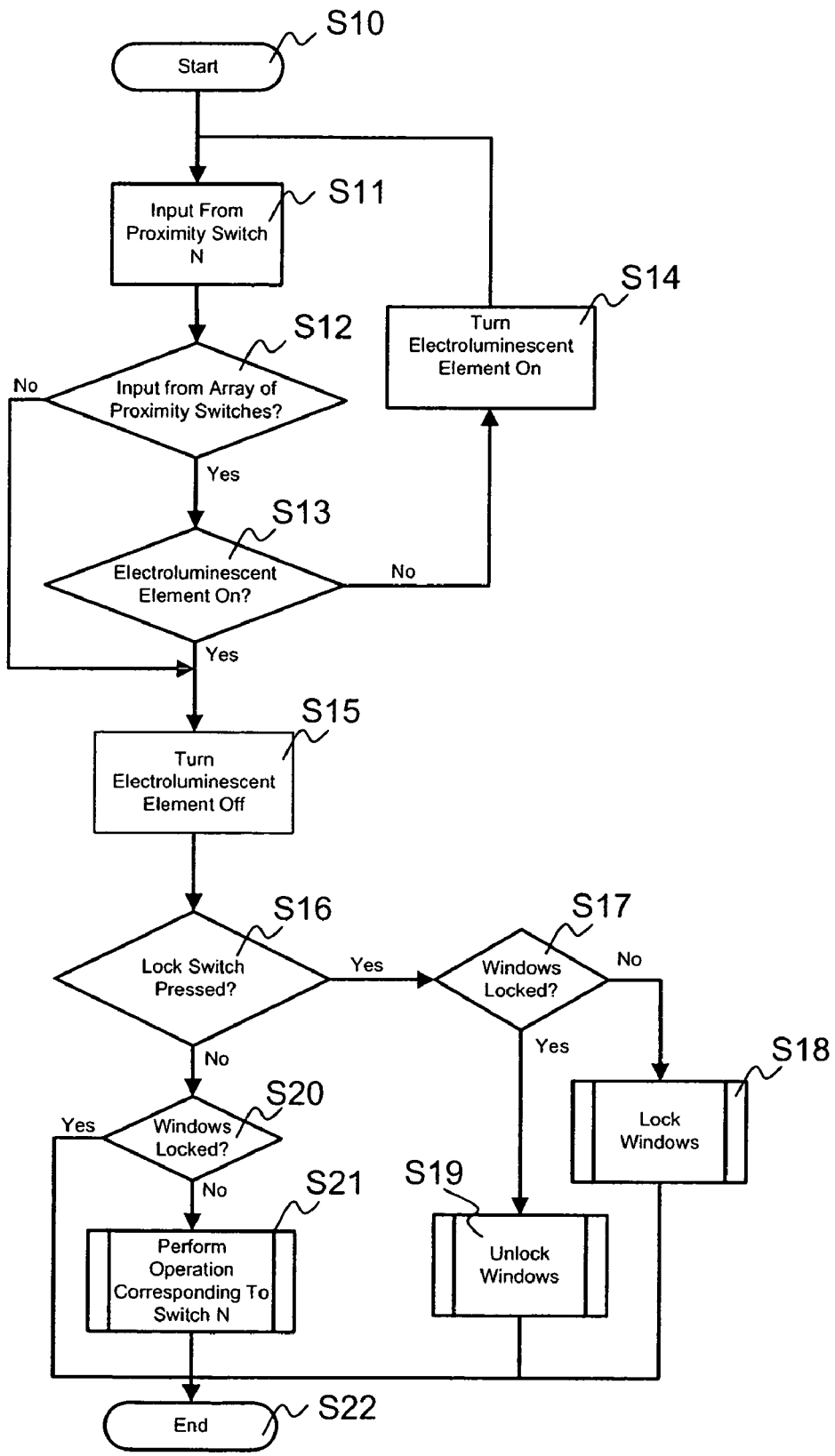
FIG. 18 is a flowchart showing various operational steps executed by a controller connected to proximity switches in the switch light panel depicted in FIGS. 15, 16 and 17, in accordance with the fourth embodiment of the present invention.

FIG. 18 is a flowchart that depicts a basic series of operation performed by the controller 256. The flowchart includes all the operations (steps) depicted in FIG. 14, but also includes step S12 where the controller 256 determines whether or not the array of proximity switches 144*f* has provided an input. If the array of proximity switches 144*f* has provided the input in step S11, then operations proceed to step S13 where a determination is made by the controller 256. If the electroluminescent element 40″ is off, it is turned on by the controller 256 in step S14. If the electroluminescent element 40″ is on, operations proceed to step S16 where the electroluminescent element 40″ is turned off by the controller 256.

Returning to step S12, if the input was from one of the proximity switches 144*a* through 144*e*, the controller 256 moves to step S16, which was described above with respect to FIGS. 13 and 14. Steps S16 through S22 in the fourth embodiment are generally the same as in the second and third embodiments. Therefore to avoid repetition, description of steps S16 through S22 is omitted.

The light panel 30 (FIG. 2) and the light panel 32 on the door handle assembly on the exterior of the car, as shown in FIG. 1, can also include a proximity switch panel configuration in accordance with any of the above described embodiments. The light panels 30 and 32 can include one or more proximity switches, and/or an array of proximity switches and an electroluminescent element. Specifically, the light panels 30 and 32 can illuminate when touched, as in the first embodiment. The light panels 30 can include the configurations in any of the second, third or fourth embodiments, but include a controller that operate a radio, air conditioning and/or other accessories of the vehicle 10.

The light panel 32 can illuminate in response to a remote control key fog being activated to unlock the doors of the vehicle 10. The light panel 32 can also illuminate and include a series of proximity switches with indicia that are connected to a controller that response to a sequence of switch inputs to unlock the door.

It should be understood from the drawings and the description herein, that any of a variety of light panels or switch light panels can be constructed and programmed for a use in a vehicle 10 to control any device installed within the vehicle 10 and be made to blend in with the interior of the passenger compartment 11.

Each of the various embodiments of the present invention can be manufactured in a variety of manners. However, a preferred method of manufacture includes the following basic steps.

A plastic film that is transparent, translucent or semi-translucent is provided with graphics (indicia) on one side thereof. The graphics are printed or otherwise formed on the plastic film to form the outer layer(s) 36 or 36'. It should be appreciated that the outer layer(s) 36 and 36' can further alternatively be covered or coated by another protective layer that is exposed to the passenger compartment 11.

Next, the first and second electrically conductive switch portions 50 and 52 (50*a* through 50*e* and 52*a* through 52*e*) are printed on to the underside of the plastic film (outer layer(s) 36 and 36'). The first and second electrically conductive switch portions 50 and 52 can be formed simultaneously or separately and an insulating coating applied to which ever of the two portions is applied first to ensure that the first and second electrically conductive switch portions 50 and 52 are electrically separated or insulated and spaced apart from one another. Alternatively, a single conductive layer can be formed on the plastic film, then portions etched away to form the first and second electrically conductive switch portions 50 and 52.

Next, the phosphor material, followed by the dielectric material is applied to form the phosphor and dielectric material layer 72. Thereafter, a conductive layer 74 is applied or printed onto the phosphor and dielectric materials 72. This layered film is then shaped to the desired three dimensional contour (switch protrusions and/or trim contoured shapes).

Last, with the layered film in the desired shape, a plastic substrate is then injection molded onto the backside of the layered film thereby forming the base portion 42 (and 42'). The base portion 42 (and 42') is formed with apertures that allow electric leads or wires to be connected with respective proximity switch(es) and the electroluminescent element.

The controller (56, 156 or 256) is then connected to the electric leads or wires. The controller includes circuitry and/or micro devices that permit programming and/or wiring to perform the above described operational steps in response to inputs from the various proximity switches. The controller also includes an inverter device that converts DC power from the battery 65 to AC current to illuminate the electroluminescent element and activate the proximity switch(es).

When power is supplied to the electroluminescent element, the light emitting materials glow through the translucent areas on the plastic film (the outer layer 36 or 36') highlighting the dark colored, opaque graphics or indicia. When the electroluminescent element is turned off, the light panel or switch light panel appears like a normal interior component. Specifically, the outer layer 36 or 36' can be coated or colored to match surrounding interior components and blend in unnoticed until illuminated.

The outer layer 36 (36') can be made from any of a variety of materials, for instance polycarbonate or a polycarbonate blend. The proximity switches and the conductive layer 74 can be made of any of a variety of translucent materials, for example, Bayer Baytron®.

The base portion 42 can be made of any of a variety of plastic materials, for example, polycarbonate or polycarbonate/ABS blend such as Bayer Bayblend® or Makrolon®.

The controllers 56, 156 and 256 can also include a microcomputer with a control program that controls the various remote devices and accessories of the vehicle 10, as discussed above. The controllers 56, 156 and 256 can also include other conventional components such as an input interface circuit, an output interface circuit, and storage devices such as a ROM (Read Only Memory) device and a RAM (Random Access Memory) device. It will be apparent to those skilled in the art from this disclosure that the precise structure and algorithms for controllers 56, 156 and 256 can be any combination of hardware and software that will carry out the functions of the present invention.

The various components and portions of the vehicle 10 are conventional components that are well known in the art. Since such components are well known in the art, these structures will not be discussed or illustrated in detail herein. Rather, it will be apparent to those skilled in the art from this disclosure that the components can be any type of structure and/or programming that can be used to carry out the present invention.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A light panel comprising:
an outer layer including a translucent portion;
a first proximity switch disposed beneath the outer layer, the first proximity switch having a first electrically conductive switch portion and a second electrically conductive switch portion that are non-movably arranged with respect to one another and arranged to form an electric field that emanates through the outer layer when the first proximity switch is energized such that the first proximity switch operates in response to fluctuations in the electric field caused by proximity or touch of a human finger;
an electroluminescent element disposed beneath the outer layer to provide backlighting to the outer layer, with one of the first and second electrically conductive switch portions of the first proximity switch forming at least a portion of an electrode of the electroluminescent element; and
a base portion disposed beneath the electroluminescent element and the first proximity switch.

2. The light panel as set forth in claim 1, wherein the second switch portion surrounds the first switch portion.

3. The light panel as set forth in claim 1, wherein the second switch portion is applied on the outer layer to at least partially coincide with the translucent portion.

4. The light panel as set forth in claim 1, wherein the electroluminescent element includes phosphor and dielectric materials between a pair of electrically conductive layers, with one of the electrically conductive layers of the electroluminescent element including one of the first and second electrically conductive switch portions of the first proximity switch.

5. The light panel as set forth in claim 1, wherein the base portion includes at least one attachment portion.

6. The light panel as set forth in claim 1, wherein the outer layer, the first proximity switch and the electroluminescent element have a contoured surface profile.

7. The light panel as set forth in claim 1, further comprising a controller electrically connected to the first proximity switch and the electroluminescent element.

8. The light panel as set forth in claim 7, wherein the controller is configured to turn on and off the electroluminescent element when the first proximity switch is operated.

9. The light panel as set forth in claim 7, wherein the controller is configured to turn on and off the electroluminescent element upon receiving a signal from a remote switch.

10. The light panel as set forth in claim 7, wherein the controller is configured to turn on the electroluminescent element when the first proximity switch is operated while the electroluminescent element is off, and
the controller is further configured to turn on at least one remote device when the first proximity switch is operated when the electroluminescent element is illuminated.

11. The light panel as set forth in claim 1, further comprising
an array of proximity switches which includes the first proximity switch as part of the array of proximity switches that each forms an electric field that emanates through the outer layer when energized and that each forms at least a portion of the electrode of the electroluminescent element.

12. The light panel as set forth in claim 11, further comprising
a controller electrically connected to the array of proximity switches, including the first proximity switch, and the electroluminescent element.

13. The light panel as set forth in claim 11, wherein the controller is configured to turn on and off the electroluminescent element when anyone of the array of proximity switches, including the first proximity switch, is operated.

14. The light panel as set forth in claim 11, wherein the controller is configured to turn on and off the electroluminescent element upon receiving a signal from a remote switch.

15. The light panel as set forth in claim 11, wherein the controller is configured to turn on the electroluminescent element when anyone of the array of proximity switches, including the first proximity switch, is operated while the electroluminescent element is off, and
the controller is further configured to turn on at least one remote device when the first proximity switch is operated when the electroluminescent element is illuminated.

16. A light panel comprising:
an outer layer including a translucent portion;
a first proximity switch disposed beneath the outer layer, the first proximity switch having a first electrically conductive switch portion and a second electrically conductive switch portion that are non-movably arranged to form an electric field that emanates through the outer layer when the first proximity switch is energized, the first switch portion being applied on the outer layer to at least partially coincide with the translucent portion;
an electroluminescent element disposed beneath the outer layer to provide backlighting to the outer layer, with one of the first and second electrically conductive switch portions of the first proximity switch forming at least a portion of an electrode of the electroluminescent element; and
a base portion disposed beneath the electroluminescent element and the first proximity switch.

17. A light panel comprising:
an outer layer including a translucent portion;
a first proximity switch disposed beneath the outer layer, the first proximity switch having a first electrically conductive switch portion and a second electrically conductive switch portion that are arranged to form an electric field that emanates through the outer layer when the first proximity switch is energized, the first and second switch portions being translucent;
an electroluminescent element disposed beneath the outer layer to provide backlighting to the outer layer, with one of the first and second electrically conductive switch portions of the first proximity switch forming at least a portion of an electrode of the electroluminescent element; and
a base portion disposed beneath the electroluminescent element and the first proximity switch.

18. A light panel comprising
an outer layer including a translucent portion;
a first proximity switch disposed beneath the outer layer, the first proximity switch having a first electrically conductive switch portion and a second electrically conductive switch portion that are non-movably arranged to form an electric field that emanates through the outer layer when the first proximity switch is energized;

an electroluminescent element disposed beneath the outer layer to provide backlighting to the outer layer, with one of the first and second electrically conductive switch portions of the first proximity switch forming at least a portion of an electrode of the electroluminescent element;

a base portion disposed beneath the electroluminescent element and the first proximity switch; and a second proximity switch that forms an electric field that emanates through the outer layer when energized and that forms at least a portion of the electrode of the electroluminescent element.

19. The light panel as set forth in claim 18, further comprising a controller electrically connected to the first and second proximity switches, and the electroluminescent element, with the controller being configured to turn on and off the electroluminescent element and the controller being configured to operate at least one remote device upon the first and second proximity switches being selectively operated.

20. The light panel as set forth in claim 19, wherein the controller is further configured to turn on the electroluminescent element when either one of the first and second proximity switches is operated while the electroluminescent element is off, and the controller is further configured to operate the at least one remote device when either one of the first and second proximity switches is operated when the electroluminescent element is illuminated.

21. A light panel comprising:

an outer layer including a translucent portion;

a first proximity switch disposed beneath the outer layer, the first proximity switch having a first electrically conductive switch portion and a second electrically conductive switch portion that are non-movably arranged to form an electric field that emanates through the outer layer when the first proximity switch is energized;

an electroluminescent element disposed beneath the outer layer to provide backlighting to the outer layer, with one of the first and second electrically conductive switch portions of the first proximity switch forming at least a portion of an electrode of the electroluminescent element;

a base portion disposed beneath the electroluminescent element and the first proximity switch; and the outer layer also includes a visible graphic.

22. The light panel as set forth in claim 21, wherein the first proximity switch is at least partially disposed directly beneath the visible graphic.

* * * * *